(12) United States Patent
Bushnell et al.

(10) Patent No.: US 12,130,672 B1
(45) Date of Patent: Oct. 29, 2024

(54) MODULAR BUTTON ASSEMBLY FOR AN ELECTRONIC DEVICE

(71) Applicant: Apple Inc., Cupertino, CA (US)

(72) Inventors: Tyler S. Bushnell, Mountain View, CA (US); Colin M. Ely, Sunnyvale, CA (US); Erik G. de Jong, San Francisco, CA (US); Trevor J. Ness, Santa Cruz, CA (US); James G. Horiuchi, Fresno, CA (US); Steven P. Cardinali, Campbell, CA (US)

(73) Assignee: APPLE INC., Cupertino, CA (US)

( * ) Notice: Subject to any disclaimer, the term of this patent is extended or adjusted under 35 U.S.C. 154(b) by 0 days.

(21) Appl. No.: 17/392,029

(22) Filed: Aug. 2, 2021

Related U.S. Application Data

(63) Continuation of application No. 15/702,721, filed on Sep. 12, 2017, now Pat. No. 11,079,812.

(51) Int. Cl.
*G06F 1/16* (2006.01)
*G04G 21/08* (2010.01)
*G06F 3/02* (2006.01)
*G06F 3/0354* (2013.01)
*G06F 3/0362* (2013.01)
*H03K 17/96* (2006.01)

(52) U.S. Cl.
CPC ............ *G06F 1/169* (2013.01); *G04G 21/08* (2013.01); *G06F 1/163* (2013.01); *G06F 3/0202* (2013.01); *G06F 3/03547* (2013.01); *G06F 3/0362* (2013.01); *H03K 17/962* (2013.01)

(58) Field of Classification Search
CPC ................................ G06F 1/169; G06F 1/163

USPC .................................................. 345/163, 184
See application file for complete search history.

(56) References Cited

U.S. PATENT DOCUMENTS

| | | |
|---|---|---|
| 2,866,141 A | 12/1958 | Frank et al. |
| 4,037,068 A | 7/1977 | Gaynor |
| 4,258,096 A | 3/1981 | Lamarche |
| 4,324,956 A | 4/1982 | Sakakino et al. |
| 4,345,119 A | 8/1982 | Latasiewicz |
| 4,581,509 A | 4/1986 | Sanford et al. |
| 4,922,070 A | 5/1990 | Dorinski |
| 5,258,592 A | 11/1993 | Nishikawa et al. |
| 5,584,380 A | 12/1996 | Naitou |
| 5,657,012 A | 8/1997 | Tait |

(Continued)

FOREIGN PATENT DOCUMENTS

| | | |
|---|---|---|
| EP | 2720129 A1 | 4/2014 |
| JP | 3034908 U | 3/1997 |
| KR | 20080045397 A | 5/2008 |

*Primary Examiner* — William Boddie
*Assistant Examiner* — Alecia D English
(74) *Attorney, Agent, or Firm* — Dorsey & Whitney LLP

(57) ABSTRACT

A modular button assembly includes a button housing that may be disposed in an opening of an enclosure of an electronic device. The modular button assembly may include an input member that forms an exterior surface of the button housing and is configured to receive inputs, for example from a user of the electronic device. The modular button assembly may further include a sensor to detect the received inputs and transmit a signal to a processor of the electronic device. The modular button assembly may be configured such that disposing the button housing in the opening of the enclosure forms a seal that prevents contaminants from entering the button housing and the enclosure.

18 Claims, 15 Drawing Sheets

(56) References Cited

U.S. PATENT DOCUMENTS

| | | |
|---|---|---|
| 6,344,791 B1 | 2/2002 | Armstrong |
| 6,355,891 B1 | 3/2002 | Ikunami |
| 6,525,278 B2 | 2/2003 | Villain et al. |
| 6,963,039 B1* | 11/2005 | Weng .................. H01H 25/041 |
| | | 200/302.1 |
| 7,119,289 B2 | 10/2006 | Lacroix |
| 7,388,167 B2 | 6/2008 | Liao et al. |
| 8,008,591 B2 | 8/2011 | Shi et al. |
| 8,167,126 B2 | 5/2012 | Stiehl |
| 8,248,815 B2 | 8/2012 | Yang et al. |
| 8,263,886 B2 | 9/2012 | Lin et al. |
| 8,263,889 B2 | 9/2012 | Takahashi et al. |
| 8,432,368 B2 | 4/2013 | Momeyer et al. |
| 8,446,713 B2 | 5/2013 | Lai |
| 8,576,044 B2 | 11/2013 | Chapman |
| 8,648,829 B2 | 2/2014 | Shahoian et al. |
| 8,885,856 B2 | 11/2014 | Sacha |
| 9,058,941 B2 | 6/2015 | Malek et al. |
| 9,064,654 B2 | 6/2015 | Whitt et al. |
| 9,089,049 B2 | 7/2015 | Perrault et al. |
| 9,204,710 B1* | 12/2015 | Burns .................... F16M 11/22 |
| 9,449,770 B2 | 9/2016 | Sanford et al. |
| 9,510,468 B2 | 11/2016 | Schack et al. |
| 9,871,330 B2 | 1/2018 | Seo et al. |
| 9,916,942 B2 | 3/2018 | Shedletsky |
| 10,831,299 B1 | 11/2020 | Lukens et al. |
| 2004/0082414 A1 | 4/2004 | Knox |
| 2004/0222979 A1* | 11/2004 | Knighton ............ G06F 3/03548 |
| | | 348/E5.025 |
| 2006/0102458 A1* | 5/2006 | Kim ........................ G07F 7/10 |
| | | 200/400 |
| 2006/0214778 A1* | 9/2006 | Beckwith ............. H03K 17/965 |
| | | 340/330 |
| 2007/0152959 A1 | 7/2007 | Peters |
| 2008/0049980 A1 | 2/2008 | Castaneda et al. |
| 2009/0015558 A1* | 1/2009 | Hung .................. A61B 5/02416 |
| | | 345/163 |
| 2009/0091543 A1 | 4/2009 | Camp, Jr. et al. |
| 2009/0236207 A1* | 9/2009 | Shi ........................ H01H 13/06 |
| | | 200/341 |
| 2009/0312051 A1 | 12/2009 | Hansson et al. |
| 2011/0255259 A1 | 10/2011 | Weber et al. |
| 2012/0044623 A1 | 2/2012 | Rivera et al. |
| 2012/0067711 A1 | 3/2012 | Yang |
| 2012/0069501 A1* | 3/2012 | Lai ........................ H01H 13/86 |
| | | 361/679.01 |
| 2012/0218233 A1* | 8/2012 | Chun ..................... G06F 1/169 |
| | | 345/184 |
| 2013/0037396 A1 | 2/2013 | Yu |
| 2013/0087443 A1 | 4/2013 | Kikuchi |
| 2013/0114225 A1 | 5/2013 | Schack et al. |
| 2013/0313087 A1 | 11/2013 | Le |
| 2015/0002753 A1 | 1/2015 | Perrault et al. |
| 2015/0060245 A1* | 3/2015 | Raupach ................ H01H 9/047 |
| | | 200/302.2 |
| 2015/0199011 A1 | 7/2015 | Fukumoto et al. |
| 2015/0221460 A1 | 8/2015 | Teplitxky et al. |
| 2015/0237757 A1 | 8/2015 | Lor et al. |
| 2015/0242605 A1 | 8/2015 | Du et al. |
| 2016/0037877 A1 | 2/2016 | Perkins et al. |
| 2016/0058375 A1 | 3/2016 | Rothkopf |
| 2016/0098107 A1 | 4/2016 | Morrell et al. |
| 2016/0100499 A1 | 4/2016 | Jung et al. |
| 2016/0225551 A1 | 8/2016 | Shedletsky |
| 2016/0270247 A1 | 9/2016 | Jones et al. |
| 2016/0313703 A1 | 10/2016 | Ely et al. |
| 2017/0069443 A1 | 3/2017 | Wang et al. |
| 2017/0069444 A1 | 3/2017 | Wang et al. |
| 2017/0069447 A1 | 3/2017 | Wang et al. |
| 2018/0210397 A1 | 7/2018 | Masone |
| 2018/0364815 A1 | 12/2018 | Moussette et al. |
| 2020/0243276 A1* | 7/2020 | Heiskanen ............ H01H 13/14 |
| 2020/0359512 A1* | 11/2020 | Wright ................... B65D 43/00 |

* cited by examiner

MODULAR BUTTON ASSEMBLY FOR AN ELECTRONIC DEVICE

CROSS-REFERENCE TO RELATED APPLICATION(S)

This is a continuation of U.S. application Ser. No. 15/702,721, filed 12 Sep. 2017, and entitled "MODULAR BUTTON ASSEMBLY FOR AN ELECTRONIC DEVICE," the entire disclosure of which is hereby incorporated in its entirety by this reference.

FIELD

Embodiments described herein relate to electronic devices, and in particular, to electronic devices that incorporate a sealed modular button assembly that includes a sensor for detecting a touch on the modular button assembly.

BACKGROUND

Many traditional electronic devices include buttons, keys, or other similar input mechanisms. Many traditional input mechanisms are difficult to seal and may introduce one or more paths through which contaminants may enter the device. Furthermore, many traditional mechanisms are structurally integrated in a way that does not facilitate component-level testing or easy repair. The embodiments described herein are directed to electronic devices having a modular button or input device that may address these and other issues that are associated with some traditional input mechanisms.

SUMMARY

Certain embodiments described herein relate to, include, or take the form of an electronic watch including an enclosure defining an enclosed volume and having a sidewall and an opening formed in the sidewall. The sidewall further includes a passage between the opening and the enclosed volume. The electronic watch further includes a processor positioned in the enclosed volume and a display operably coupled to the processor. The electronic watch further includes a modular button assembly. The modular button assembly includes a button housing and an input member attached to the button housing and defining an input surface. The modular button assembly further includes a sensor positioned below the input surface and configured to detect an input on the input surface. The modular button assembly further includes a seal positioned between the button housing and the enclosure and around the passage. The electronic device further includes an electrical connector extending from the modular button assembly and into the enclosed volume through the passage. The electrical connector operably couples the sensor and the processor.

Other embodiments described generally reference an electronic watch including a display, an enclosure at least partially surrounding the display, and a processor operably coupled to the display. The enclosure has a sidewall and an opening formed in the sidewall. The electronic watch further includes a modular button assembly disposed in the opening. The modular button assembly includes a button housing and an input member attached to the button housing and defining an input surface. The modular button assembly further includes a sensor positioned below the input surface and configured to detect an input on the input surface and a seal positioned between the button housing and the enclosure. The electronic device further includes a fastener attaching the modular button assembly to the enclosure and placing the seal in compression between the button housing and the enclosure. The display includes a graphical output that is responsive to the input provided to the modular button assembly.

Still further embodiments described herein generally reference an electronic device including an enclosure having an opening and a modular button assembly disposed in the opening. The modular button assembly includes a button housing defining an input surface and a capacitive sensor positioned below the input surface and configured to detect an input on the input surface. The modular button assembly further includes a seal positioned between the button housing and the enclosure. The electronic device further includes an attachment mechanism attaching the modular button assembly to the enclosure. Attaching the modular button assembly to the enclosure compresses the seal between the button housing and the enclosure.

BRIEF DESCRIPTION OF THE DRAWINGS

Reference will now be made to representative embodiments illustrated in the accompanying figures. It should be understood that the following descriptions are not intended to limit this disclosure to one preferred embodiment. To the contrary, the disclosure provided herein is intended to cover alternatives, modifications, and equivalents as may be included within the spirit and scope of the described embodiments, and as defined by the appended claims.

The use of the same or similar reference numerals in different figures indicates similar, related, or identical items.

Figure 1:
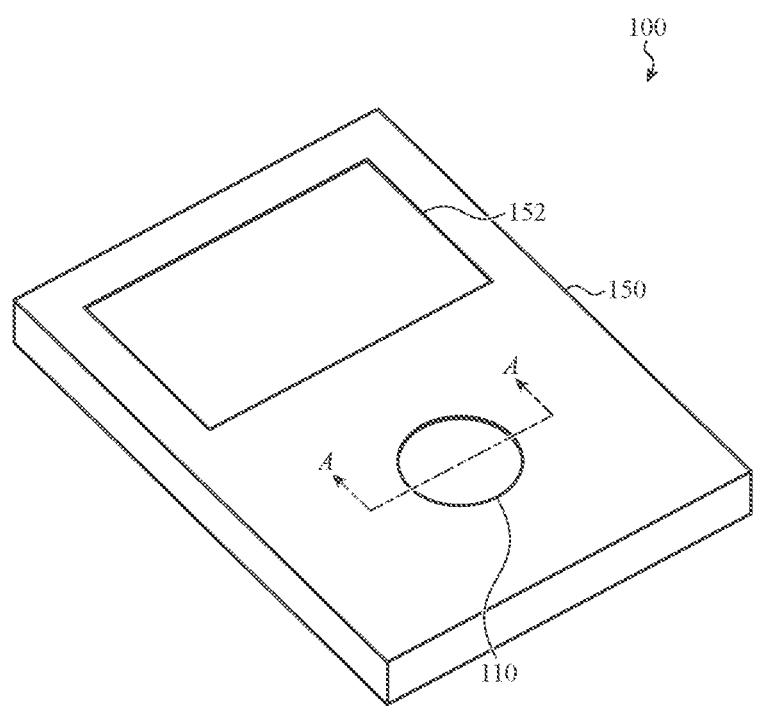
FIG. 1 illustrates an example electronic device having a modular button assembly as described herein.

Additionally, it should be understood that the proportions and dimensions (either relative or absolute) of the various features and elements (and collections and groupings thereof) and the boundaries, separations, and positional relationships presented therebetween, are provided in the accompanying figures merely to facilitate an understanding of the various embodiments described herein and, accordingly, may not necessarily be presented or illustrated to scale, and are not intended to indicate any preference or requirement for an illustrated embodiment to the exclusion of embodiments described with reference thereto.

DETAILED DESCRIPTION

Reference will now be made in detail to representative embodiments illustrated in the accompanying drawings. It should be understood that the following descriptions are not intended to limit the embodiments to one preferred embodiment. To the contrary, it is intended to cover alternatives, modifications, and equivalents as can be included within the spirit and scope of the described embodiments as defined by the claims.

The embodiments disclosed herein are directed to a modular button assembly for use as part of an electronic device. An electronic device receives inputs from users manipulating the modular button assembly. Example user inputs include force inputs, touch inputs, biometric inputs, and the like. A modular button assembly, as described herein, includes one or more buttons for receiving user inputs. The modular button assembly may be configured to control or otherwise provide inputs to the electronic device. In various embodiments, the modular button assembly may be used to control a graphical output of a display of the electronic device. A modular button assembly may be configured, for example, as a power button, a key of a keyboard, a control button (e.g., volume control), a home button, a watch crown, and so on.

Example embodiments described herein are directed to a modular button assembly that can be installed in a device enclosure of an electronic device. The attachment or installation of the modular button assembly to the electronic device may seal the electronic device enclosure, the modular button assembly, or both to inhibit the ingress of moisture or contaminants. The modular button assembly may facilitate modular testing and simplified device repair.

Some forms of button assemblies are integrated into the interior components of an electronic device. Many button assemblies include multiple components that are not housed or packaged distinctly from other components of the electronic device. Similarly, multiple components of a traditional button assembly may be coupled to a device separately, which may complicate installation and maintenance.

In contrast, some button assemblies described herein are modular assemblies. For example, the components of the button assembly may be disposed in a housing that is different or distinct from a device enclosure. The housing (e.g., a button housing) of the modular button assembly may be disposed in an opening or on a surface of an enclosure and attached to the electronic device in a variety of ways. The modular nature of the modular button assembly provides several advantages. For example, the manufacturing process of a wearable electronic device may be simplified because the modular button assembly can be constructed separately from the rest of the device and installed in a relatively quick and simplified manner as compared to, for example, a button assembly with multiple separate components that are integrated into a device enclosure. The modular button assembly may further be tested separately from the rest of the device, both during and after construction, which simplifies quality assurance and troubleshooting. For instance, a seal of the modular button assembly may be tested separately from the rest of the device to ensure that the modular button assembly satisfactorily excludes contaminants and/or moisture once the device is assembled. Further, the modular button assembly may be calibrated or adjusted (e.g., shimmed) separately from the rest of the device to ensure satisfactory button performance and/or feel once the device is assembled. Additionally, the modular button assembly may be removed from the assembly for testing and/or replacement, which may reduce device maintenance complexity and cost.

The modular button assemblies described herein may include a seal that inhibits contaminants from entering the interior volume and/or an enclosure of the electronic device. "Contaminants," as used herein, may be used to refer to foreign matter that is not intended to be present in the interior volume or the electronic device. Example contaminants include liquids, such as water, and solid matter such as lint, dust, and food particles. In one embodiment, a seal is positioned between the button housing and one or more surfaces of the enclosure of the electronic device.

The input member may be located on or near an outer surface of the button housing and configured to receive user inputs. The input member may be touched, pressed, or otherwise interacted with by a user. The input member may translate, deflect, bend, or otherwise move in response to user input.

The sensor detects inputs received at the input member and provides an output signal associated with the detected input, for example, to a processor of an electronic device. The sensor may be implemented as a capacitive sensor, a resistive sensor, a contact sensor, a magnetic sensor, and so on. The output of the sensor may indicate whether an input (e.g., a touch, a press, or the like) occurs, where an input occurs, and/or a measure of the input (e.g., a force measurement). The modular button assembly may additionally or alternatively include a biometric sensor such as a fingerprint reader or the like.

The foregoing embodiments and other embodiments are discussed below with respect to FIGS. 1-12. However, those skilled in the art will readily appreciate that the detailed description given herein with respect to these figures is for explanatory purposes and should not be construed as limiting.

FIG. 1 illustrates an example electronic device 100 that may incorporate a modular button assembly 110 as described herein. The electronic device 100 includes an enclosure 150 and a modular button assembly 110 disposed in an opening of the enclosure. The modular button assembly 110 includes an input surface on which inputs can be received and a sensor for detecting received inputs. In one embodiment, the enclosure 150 defines an enclosed volume, and may include a passage between the enclosed volume and the opening such that the modular button assembly 110 and additional components of the electronic device 100 may be physically coupled, for example by an electrical connector.

Unlike traditional buttons, the modular button assembly 110 includes a sealed button housing to inhibit moisture or contaminants from entering the button housing. Further, the modular button assembly 110 includes a seal between the button housing and the enclosure to inhibit moisture or contaminants from entering the enclosure 150. In various embodiments, disposing the modular button assembly 110 in the opening or otherwise attaching the modular button assembly to the enclosure 150 causes the seal to be placed in compression between the button housing and the enclosure such that moisture and contaminants are inhibited from entering the enclosure and the button housing. For example, the seal may be disposed around the passage of the enclosure 150 to inhibit the entry of moisture and contaminants into the enclosed volume.

The modular button assembly 110 may be disposed at any of several locations of the enclosure 150. For example, the modular button assembly 110 may be positioned along a surface of the enclosure 150 as depicted in FIG. 1, in which the modular button assembly 110 is disposed on a same surface as the display 152, for example as a button. Alternatively or additionally, the modular button assembly 110 may be positioned on a different surface or portion of an electronic device 100, such as a sidewall, a top surface, a bottom surface, and the like.

The modular button assembly 110 may be shaped in any of several geometries. For example, the modular button assembly 110 may be circular, oblong, or rectangular. In embodiments in which the modular button assembly 110 extends from the electronic device 100, the modular button assembly 110 may present a first geometry for a portion extending from the electronic device, and a second geometry for another portion contained within the enclosure 150.

The electronic device 100 can also include one or more internal components (not shown) typical of a computing or electronic device, such as, for example, one or more processors, memory components, network interfaces, and so on. Example device components are discussed in more detail below with respect to FIG. 12. It should be appreciated that any number of electronic devices may incorporate a modular button assembly, including (but not limited to): computers; personal digital assistants; media players; watches; other wearable devices; touch-sensitive devices; keypads; keyboards; and so on.

The enclosure 150 provides a device structure, defines an internal volume of the electronic device 100, and houses device components. In various embodiments, the enclosure 150 may be constructed from any suitable material, including metals (e.g., aluminum, titanium, and the like), polymers, ceramics (e.g., glass, sapphire), and the like. In one embodiment, the enclosure 150 is constructed from multiple materials. The enclosure 150 can form an outer surface or partial outer surface and protective case for the internal components of the electronic device 100.

The display 152 can be implemented with any suitable technology, including, but not limited to liquid crystal display (LCD) technology, light emitting diode (LED) technology, organic light-emitting display (OLED) technology, organic electroluminescence (OEL) technology, or another type of display technology. The display 152 provides a graphical output, for example associated with an operating system, user interface, and/or applications of the electronic device 100. In one embodiment, the display 152 includes one or more sensors and is configured as a touch-sensitive (e.g., single-touch, multi-touch) and/or force-sensitive display to receive inputs from a user. In various embodiments, a graphical output of the display 152 is responsive to inputs provided to the modular button assembly.

Figure 2:
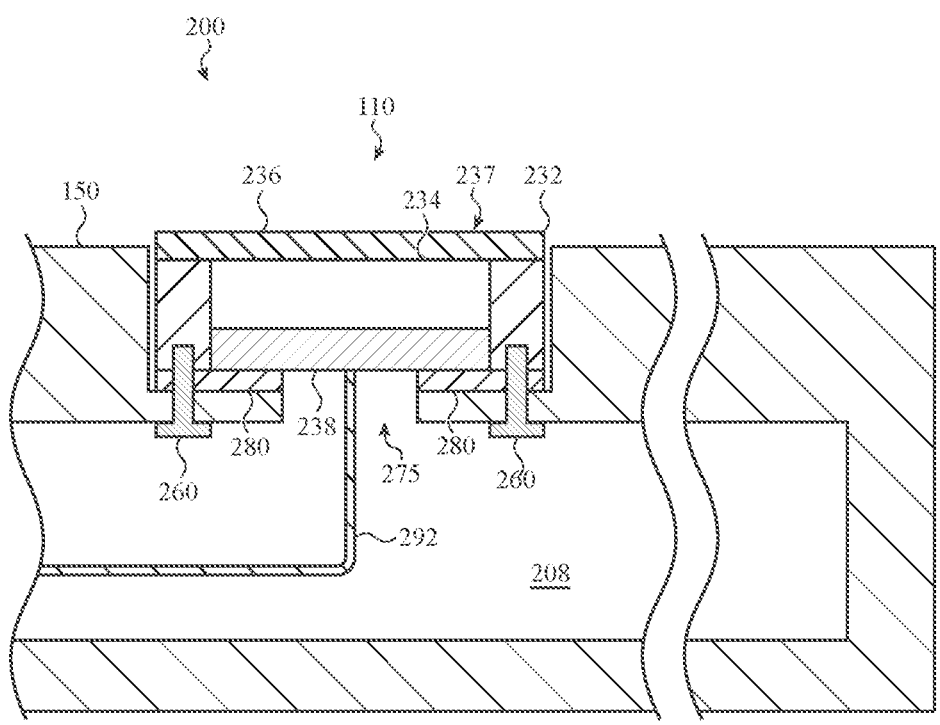
FIG. 2 is a cross-section of a modular button assembly disposed in an opening of an electronic device taken through section A-A of FIG. 1.

FIG. 2 is a cross-section 200 of a modular button assembly disposed in an opening of an electronic device taken through section A-A of FIG. 1. The modular button assembly (e.g., the modular button assembly 110 of FIG. 1) is disposed in an opening of an enclosure of an electronic device (e.g., the enclosure 150 of the electronic device 100 of FIG. 1).

In various embodiments, the modular button assembly 110 is self-contained or modular. The modular nature of the modular button assembly provides several advantages. The modular button assembly 110 may be installed and removed easily. Further, the manufacturing process of a wearable electronic device may be simplified because the modular button assembly 110 can be constructed separately from the rest of the device and installed in a relatively quick and simplified manner as compared to, for example, a traditional button assembly with components that are integrated into a device enclosure. The modular button assembly may further be tested separately from the rest of the device, both during and after construction, which simplifies quality assurance and troubleshooting. The modular button assembly may be removed from the assembly for testing and/or replacement, which may reduce device maintenance complexity and cost. The modular nature of the modular button assembly also allows the modular button assembly and the enclosure of the electronic device in which the modular button assembly is disposed to be sealed, thereby inhibiting the entry of moisture or contaminants into the enclosure and/or the modular button assembly.

The modular button assembly 110 defines an input surface 237 on the exterior of the modular button assembly for receiving inputs, for example from users (e.g., touches, presses, and the like). The input surface 237 receives inputs, for example from users. Inputs may include presses, touches, or other interactions between a user and the input surface 237. A sensor 238 is positioned below the input surface and detects inputs received on the input surface.

In the embodiment shown in FIG. 2, the enclosure 150 defines an enclosed volume 208, and includes a passage 275 between the enclosed volume and the opening of the enclosure such that the sensor 238 and components of the electronic device 100 (e.g., a processor) may be operably coupled to facilitate communication. In the example of FIG. 2, an electrical connector 292 is coupled to the sensor 238 and extends through the passage 275 and into the enclosed volume 208. The electrical connector 292 is illustrated as a flex cable, but may be any suitable electrical connector for facilitating communication between the sensor and components of the electronic device 100, such as wire, cable, and the like.

The modular button assembly 110 includes a button housing 232 that forms an exterior structure of the modular button assembly. The button housing 232 forms an exterior structure of the modular button assembly. The button housing 232 defines an interior volume 234. The interior volume 234 may include the components of the modular button assembly such as a processor, data storage memory, and the components described below.

The modular button assembly 110 also includes a seal 280 between the enclosure 150 and the button housing 232. The seal 280 is disposed around the passage 275 to inhibit the entry of moisture and contaminants into the enclosed volume and/or the button housing 232. In FIG. 2, the seal 280 is a gasket made of rubber, plastic, or another suitable material that is compressed between the button housing 232 and the enclosure 150 when the modular button assembly 110 is disposed in the opening of the enclosure. In various embodiments, the seal may be any suitable mechanism or mechanisms for inhibiting the entry of moisture and contaminants to the button housing, the enclosure, or both. Example seals include any type of mechanical seal, adhesive, sealant, or the like, including but not limited to, gaskets, O-rings, face seals, plugs, washers, and the like. In one embodiment, the seal 280 extends at least partially into the passage 275 and/or the enclosed volume 208. For example, the seal 280 may include a sleeve or boot that extends into the passage 275 and/or the enclosed volume 208. The sleeve or boot may be formed of a flexible material such as silicone and may be disposed around the electrical connector 292. In one embodiment, the sleeve or boot forms a seal around the electrical connector 292 using glue or another adhesive. The button housing 232 may be sealed at one or more locations such that contaminants are prevented from entering the interior volume 234.

An input member 236 is attached to the button housing 232 and defines the input surface 237. The input member 236 is shown as a separate component that is attached to the button housing 232, but in various embodiments, the input member 236 may be integrated as an exterior surface of the button housing 232, or it may be a separate component disposed on, within, or outside of the button housing 232. In the case in which the input member 236 is integrated as an exterior surface of the button housing, the button housing may define the input surface. The input member 236 may comprise one or more layers. In one embodiment, an outer layer is a cap formed of a durable material such as sapphire, and the cap forms an exterior surface of the button housing 232.

In one embodiment, the input member 236 translates, deflects, bends, or otherwise moves or is displaced relative to other parts of the modular button assembly in response to user input (e.g., a press, a touch) on the input surface 237. For example, the input member 236 may be configured to bend as a beam (e.g., a fixed-free beam or a fixed-fixed beam) attached to the button housing 232 or the enclosure at one or more edges or sides, and is configured to deflect or bend in response to user input. The input member 236 may also bend or deform as a diaphragm or flexible wall.

In another embodiment, the input member 236 is configured to translate, for example up and down with respect to FIG. 2, in response to inputs on the input surface 237. For example, the input member 236 may be coupled to or otherwise disposed on one or more elastic members such that the input member may move relative to the button housing 232 responsive to user input. Example elastic members include springs, gels, elastomers, or the like. In another embodiment, the input member 236 may include a compliant layer or portion such that the input member compresses or otherwise deforms in response to user input. Similarly, the input member 236 may be a dome switch configured to compress or translate.

A sensor 238 detects inputs received at the input surface 237 and provides an output signal associated with the detected input, for example, to a processor of an electronic device. The sensor 238 may be partially or entirely disposed in the interior volume 234 and/or disposed on or near a surface of the button housing 232, such as the input surface 237. The output of the sensor 238 or the magnitude of the output may indicate whether an input occurs and/or a degree of measure of the input (e.g., a measure of a force applied to the input surface). The sensor 238 may detect inputs by detecting movement or displacement of the input member 236 (e.g., bending, translating, deflecting, and the like). In one embodiment, the sensor 238 is capable of detecting movement or displacement of the input member 236 between 1 and 50 microns. Alternatively or additionally, the sensor 238 may detect inputs by detecting interaction with the input surface 237 that does not result in movement of the input member 236, such as an object near or touching the input surface.

In one embodiment, the sensor 238 may detect multiple types of inputs to the same input surface 237. For example, the sensor 238 may be configured to detect a touch and a press that exceeds a threshold (e.g., a force threshold).

In one embodiment, the sensor 238 is a capacitive sensor that detects changes in capacitance based on inputs received on the input surface 237. In various embodiments, the capacitive sensor may be configured to detect mutual capacitance and/or self-capacitance.

A sensor for detecting mutual capacitance can include a capacitive member (e.g., a plate) that is capacitively coupled to the input member 236 and/or the input surface 237 and an output circuit configured to measure the capacitance between the capacitive member and the input member or input surface. As the input member or input surface translates, deflects, or otherwise moves, the measured capacitance between the input member and the sensor 238 changes. In one embodiment, the capacitive plate is capacitively coupled to a reference or ground capacitive member disposed in the input member 236. In another embodiment, the input member 236 does not include a reference or ground capacitive plate, but the capacitive plate is capacitively coupled to the input member itself.

A sensor for detecting self-capacitance can include a capacitive member disposed in the modular button assembly (e.g., below the input surface, within the input member, or the like) with an output circuit configured to measure the capacitance between the capacitive member and an object near or touching the input surface 237. For example, the sensor 238 may detect a capacitive virtual ground effect of an input instrument such as a finger or other body part touching the input surface 237. In another embodiment, the sensor 238 detects the presence of objects near, but not necessarily touching the input surface 237 such as a user's finger approaching the input surface 237. The measured capacitance from either type of sensor may be interpreted, for example by a processor of an electronic device, as an input.

In another embodiment, the sensor 238 is a contact sensor. Movement of the input member 236 may cause a contact coupled to the input member to touch a contact disposed within the housing, thereby registering an input by, for example, closing a circuit. In another embodiment, the sensor 238 may be a switch, (e.g., a tactile dome switch) disposed in the interior volume 234 that is depressed responsive to movement or displacement of the input member 236. In still another embodiment, the sensor 238 is a resistive sensor such as a piezo resistor that detects changes in resistance caused by movement of the input member 236.

In another embodiment, the sensor 238 may be configured to perform biometric sensing. For example, the sensor 238 may be implemented as a fingerprint reader located on or near the input surface 237. The sensor 238 may be any type of biometric sensor that provides a signal associated with a biometric of a user. For example, the sensor 238 may provide a signal that can be used to identify a fingerprint. The fingerprint biometric may be obtained by any means known in the art, including a capacitive fingerprint sensor, an ultrasonic fingerprint sensor, an optical fingerprint sensor, and so on.

In still another embodiment, the sensor 238 includes a camera (or other optical sensor) for detecting inputs and/or performing biometric sensing. As one example, the camera may detect inputs by optically detecting a fingertip contacting the input surface 237. The camera and/or a processor of the electronic device may be further configured to detect an input force by processing images captured by the camera. For example, the processor may determine an input force by determining an amount of surface area of the input surface 237 in contact with the user's finger and/or a change in the amount of surface area over time. Such changes in surface area (or absolute amounts of surface area) contacted by a user's finger, or other structure, may be correlated to force exerted on the input surface 237. For example, as a user exerts more force on the input surface 237, the surface area of the input surface 237 that the user's finger contacts increases.

The sensor 238 may be disposed on a substrate, such as a printed circuit board. In one embodiment, the substrate additionally or alternatively includes a light such as a light emitting diode. The input member 236 may be at least partially translucent or transparent such that the modular button assembly emits light.

Although a set of example sensor types are described above, the sensor 238 may be any type of sensor that is suitable for measuring inputs. For example, in addition to the sensors described above, the sensor 238 may be a magnetic sensor, an accelerometer, a flex sensor, or the like.

In one embodiment, the modular button assembly 110 is configured to produce a haptic output (e.g., a tactile output), for example using a haptic actuator. For example, the modular button assembly provides feedback in response to a sensed touch, to confirm an input, and so on.

Attachment mechanisms 260 (e.g., fasteners) attach the modular button assembly 110 to the enclosure 150 and place the seal 280 in compression to inhibit moisture and contaminants from entering the enclosed volume 208 and/or the button housing 232. In one embodiment, the modular button assembly includes two attachment mechanisms 260 positioned along opposite sides of the passage 275. In other embodiments, one or more attachment mechanisms 260 may be disposed in any suitable location for attaching the modular button assembly 110 to the enclosure. Example attachment mechanisms include fasteners, such as screws, bolts, nails, clips, springs, hinges, magnets, wire, tape, threads, and the like. Additional example attachment mechanisms include adhesives, such as glue, cement, epoxy, and the like. In still another example, the attachment mechanism is a result of a joining method such as a welding, soldering, crimping, brazing, pressure fitting, and the like. In various embodiments, the attachment mechanisms may include a combination of several different attachment mechanisms, and the attachment mechanisms may be permanent or non-permanent. The modular button assembly, the enclosure, or both may include attachment receptacles for interfacing with attachment mechanisms to facilitate attachment. Example attachment receptacles include holes, threaded holes, brackets, loops, hooks, clips, or other features or components configured to engage the attachment mechanism 260.

As shown in FIG. 2, the modular button assembly 110 may be positioned to protrude from a surface of the enclosure. Alternatively, the modular button assembly may be positioned such that it is flush with a surface of the enclosure to present a substantially planar input member relative to the surface of the electronic device. In yet another alternative, the modular button assembly may be positioned to be recessed in a surface of the enclosure. Other configurations of the mounting of the modular button assembly are possible. For example, the exterior of the modular button assembly may be conformal with an adjacent exterior surface of the enclosure, or may be depressed with respect to an adjacent surface of the enclosure.

Figure 3A:
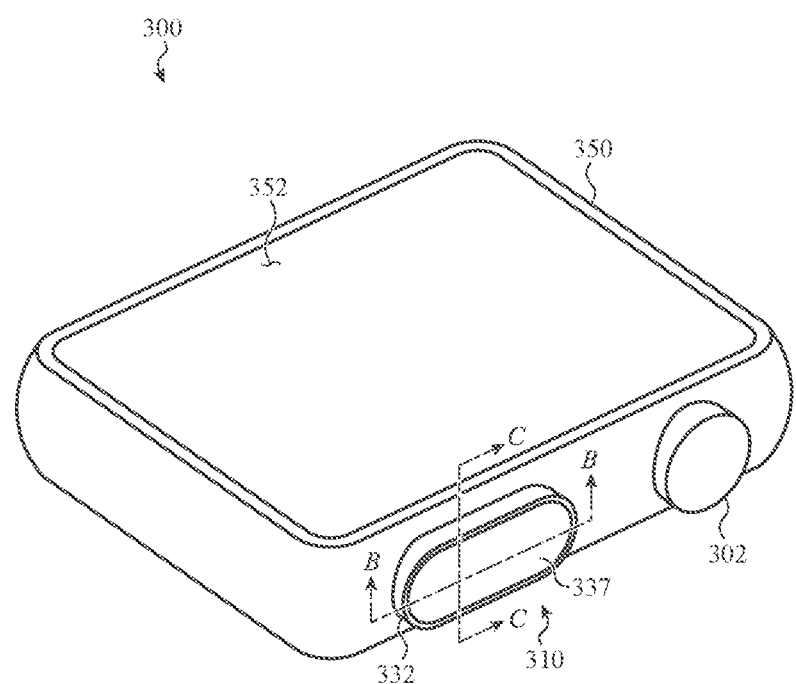
FIG. 3A illustrates an example wearable electronic device having a modular button assembly as described herein.

As described above with respect to FIGS. 1 and 2, a modular button assembly (e.g., modular button assembly 110) may be disposed in any electronic device. In one embodiment, the modular button assembly is disposed in a wearable electronic device such as a watch. FIG. 3A illustrates an example wearable electronic device 300 that may incorporate a modular button assembly 310 as described herein.

In the illustrated embodiment, the electronic device 300 is implemented as a wearable computing device (e.g., an electronic watch). Other embodiments can implement the electronic device differently. For example, the electronic device can be a smart telephone, a gaming device, a digital music player, a device that provides time, a health assistant, and other types of electronic devices that include, or can be connected to a sensor(s).

Figure 12:
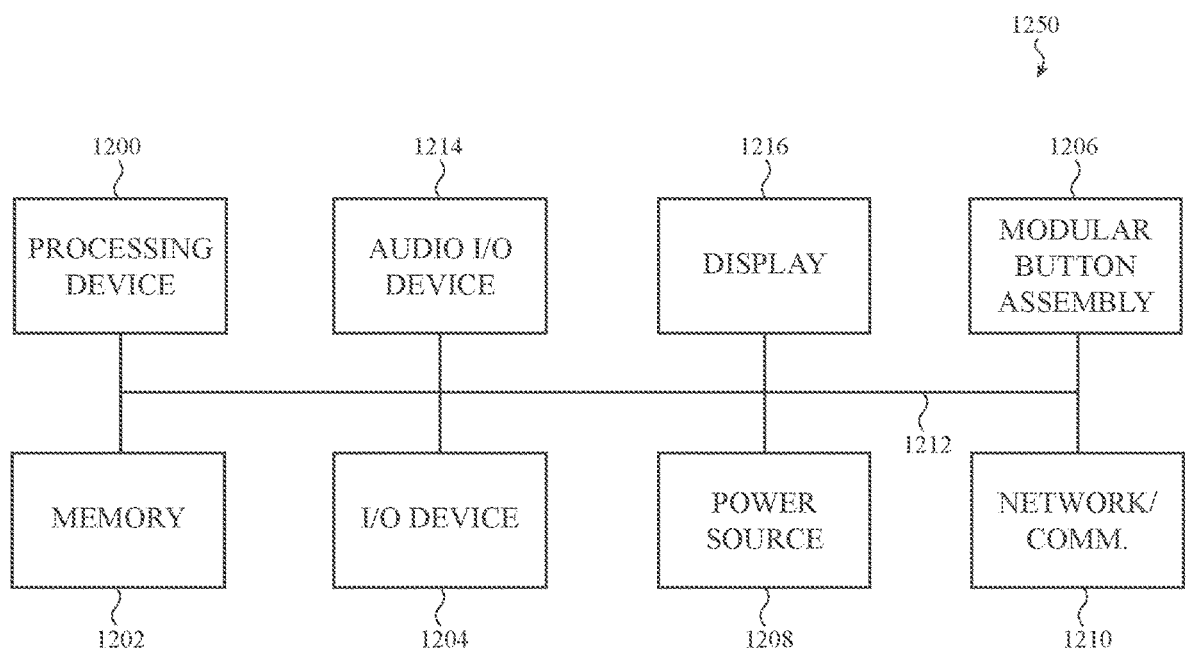
FIG. 12 is an illustrative block diagram 1250 of an electronic device such as described herein.

In the embodiment of FIG. 3A, the wearable electronic device 300 includes an enclosure 350 at least partially surrounding a display 352, a watch crown 302, and one or more modular button assemblies 310. The wearable electronic device 300 can also include one or more internal components (not shown) typical of a computing or electronic device, such as, for example, one or more processors, memory components, network interfaces, and so on. FIG. 12 depicts an example computing device, the components of which may be included in the wearable electronic device 300.

Returning to FIG. 3A, the modular button assembly 310 is disposed in a sidewall of the enclosure 350, and is permanently or releasably attached to the enclosure 350. The modular button assembly 310 includes a button housing 332 that houses internal components of the modular button assembly 310. In some embodiments, a portion of the button housing 332 protrudes from the enclosure 350. A portion of the button housing 332 may be disposed within the enclosure 350. The modular button assembly 310 includes an input surface 337 for receiving user inputs.

The enclosure 350 provides a device structure, defines an internal volume of the wearable electronic device, and houses device components. In various embodiments, the enclosure 350 may be constructed from any suitable material, including metals (e.g., aluminum, titanium, and the like), polymers, ceramics (e.g., glass, sapphire), and the like. In one embodiment, the enclosure 350 is constructed from multiple materials. The enclosure 350 can form an outer surface or partial outer surface and protective case for the internal components of the wearable electronic device 300, and may at least partially surround the display 352. The enclosure 350 can be formed of one or more components operably connected together, such as a front piece and a back piece. Alternatively, the enclosure 350 can be formed of a single piece operably connected to the display 352.

The display 352 can be implemented with any suitable technology, including, but not limited to liquid crystal display (LCD) technology, light emitting diode (LED) technology, organic light-emitting display (OLED) technology, organic electroluminescence (OEL) technology, or another type of display technology. The display 352 provides a graphical output, for example associated with an operating system, user interface, and/or applications of the electronic device 300. In one embodiment, the display 352 includes one or more sensors and is configured as a touch-sensitive (e.g., single-touch, multi-touch) and/or force-sensitive display to receive inputs from a user. In various embodiments, a graphical output of the display 352 is responsive to inputs provided to the modular button assembly.

The watch crown 302 receives inputs, for example from a user. In one embodiment, the watch crown 302 is configured to rotate about an axis and translate along the axis in response to manipulation. The watch crown 302 may further include a switch such as a dome switch to provide a tactile response to translation of the watch crown. In some embodiments, a modular button assembly may be integrated with the watch crown 302 such that the watch crown has some or all of the characteristics of the modular button assemblies described herein.

The wearable electronic device 300 can be permanently or removably attached to a band (not shown). The band may be used to attach the wearable electronic device 300 to the body of a user. The band can be made of any suitable material, including, but not limited to, leather, metal, rubber or silicon, fabric, and ceramic. In the illustrated embodiment, the band is a wristband that wraps around the user's wrist. The wristband can include an attachment mechanism, such as a bracelet clasp, Velcro, and magnetic connectors. In other embodiments, the band can be elastic or stretchable such that it fits over the hand of the user and does not include an attachment mechanism.

Figure 3B:
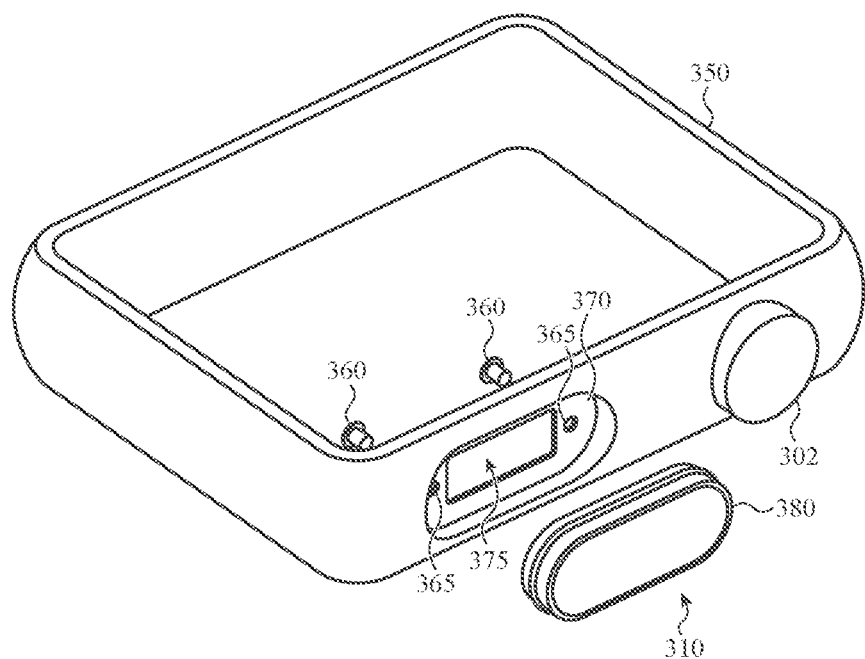
FIG. 3B illustrates an exploded view of the enclosure and the modular button assembly of FIG. 3A.

FIG. 3B illustrates an exploded view of the enclosure 350 and the modular button assembly 310 of FIG. 3A. The modular button assembly 310 is shaped or adapted such that it may be disposed in an opening 370 of the enclosure 350. The opening 370 includes a depression for accepting the modular button assembly 310. One or more electrical connectors (e.g., wires, traces, cables, flexes, and the like) may pass through a passage 375 to facilitate wired communication between the modular button assembly 310 and other components of the wearable electronic device.

In the embodiment of FIG. 3B, the attachment mechanisms 360 are threaded fasteners (e.g., screws, bolts, and the like) configured to attach the modular button assembly to the enclosure. The modular button assembly 310 includes one or more attachment receptacles configured to receive the attachment mechanisms 360, and the enclosure 350 includes attachment holes 365. The modular button assembly may be attached to the enclosure by attachment mechanisms that extend through the attachment holes and into the attachment receptacles. In one embodiment, the modular button assembly includes a first threaded fastener positioned along a side of the passage 375 and a second threaded fastener positioned along an opposite side of the passage 375. The attachment configuration described above is described as an example for illustrative purposes, and in various embodiments the modular button assembly 310 may be attached to the enclosure 350 in any suitable manner as described above with respect to FIG. 2.

Returning to FIG. 3B, the modular button assembly 310 may include a seal 380 to seal the modular button assembly, the enclosure 350, or both. In one embodiment, the seal 380 is an O-ring seal disposed around a surface of the button housing such that when the modular button assembly is installed in the enclosure, the seal 380 contacts a surface of the enclosure 350 inside the opening 370 such that the modular button assembly and the enclosure are sealed. The seal 380 is shown as a single O-ring seal for purposes of illustration, but in various embodiments, there may be multiple seals 380 and each seal 380 may be any type of mechanical seal, adhesive, seal, or the like, including but not limited to, gaskets, O-rings, face seals, plugs, washers, and the like.

Like the modular button assembly 110 of FIGS. 1 and 2, the modular button assembly 310 may be self-contained or modular such that it may be installed and removed easily. The modular nature of the modular button assembly provides several advantages. For example, the manufacturing process of a wearable electronic device may be simplified because the modular button assembly can be constructed separately from the rest of the device and installed in a relatively quick and simplified manner as compared to, for example, a button assembly with components that are integrated into a device enclosure. The modular button assembly may further be tested separately from the rest of the device, both during and after construction, which simplifies quality assurance and troubleshooting. The modular button assembly may be removed from the assembly for testing and/or replacement, which may reduce device maintenance complexity and cost.

Figure 4A:
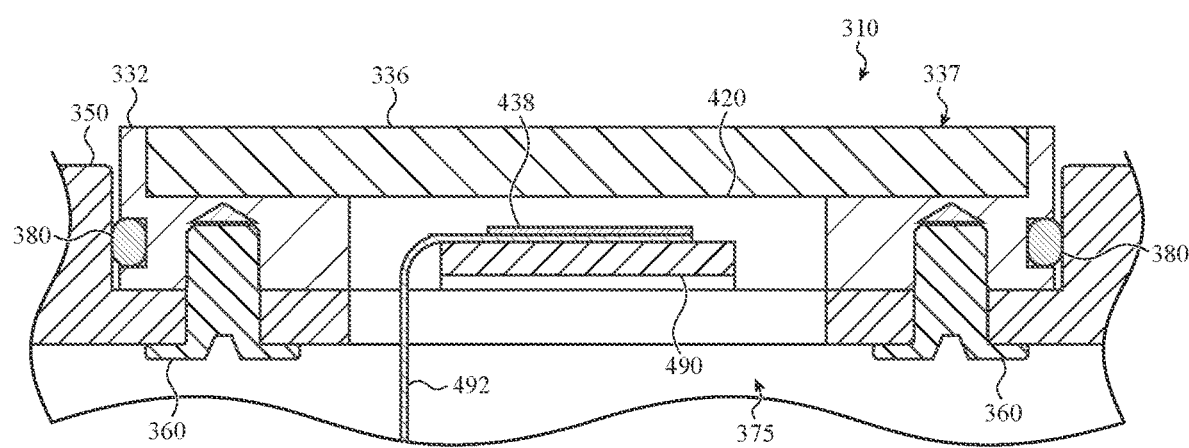
FIG. 4A illustrates a cross-section of the modular button assembly disposed in a device enclosure, along section B-B of FIG. 3A.
Figure 4B:
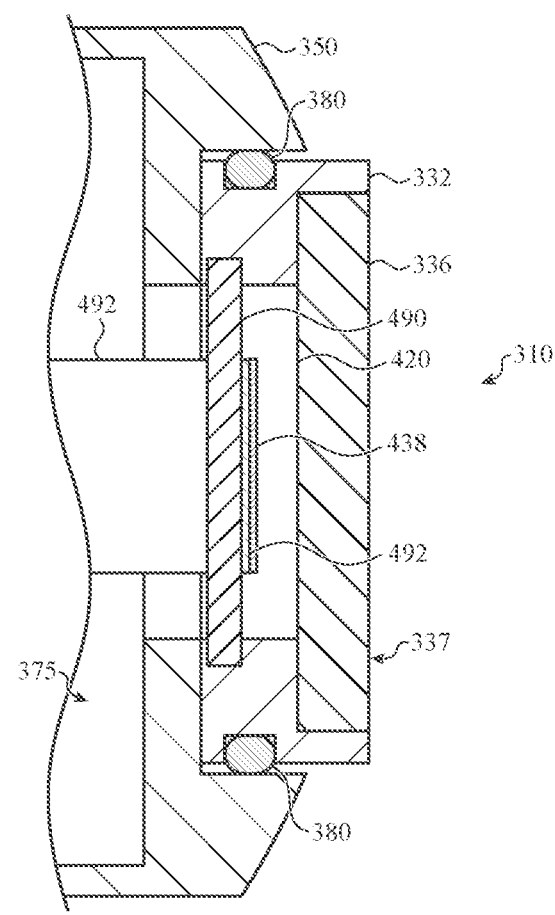
FIG. 4B illustrates a cross-section of the modular button assembly disposed in a device enclosure, taken through section C-C of FIG. 3A.

FIG. 4A illustrates a cross-section of the modular button assembly 310 disposed in a device enclosure 350, taken through section B-B of FIG. 3A. FIG. 4B illustrates a cross-section of the modular button assembly 310 disposed in a device enclosure 350, taken through section C-C of FIG. 3A. FIGS. 4A-4B show the modular button assembly installed in an opening of the enclosure 350. The modular button assembly is attached to the enclosure by two attachment mechanisms 360 (e.g., fasteners). The seal 380 is contacting the surfaces of the modular button assembly and the opening of the enclosure such that moisture and contaminants are inhibited from entering the enclosure and the modular button assembly.

FIGS. 4A-4B illustrate various internal components of the modular button assembly disposed in the internal volume 420 of the button housing 332, including a sensor 438, a sensor bracket 490, and a flex cable 492. The input member 336 is configured to bend as a beam or plate extending across the top surface of the button housing 332. The input member 336 is capable of deflecting, or otherwise moving relative to the sensor 438 (e.g., up and down with respect to FIG. 4A), for example responsive to a user touching or pressing on the input surface 337. The sensor 438 is configured to detect deflection of the input member 336, for example using capacitive sensing. The sensor 438 may include a capacitive sensor that is capacitively coupled to a ground plane or reference plane disposed in the input member 336. In another embodiment, the input member 336 does not include a reference or ground plane. The sensor 438 is attached to the button housing 332 using the sensor bracket 490. The flex cable 492 is operable to couple the sensor 438 to the processor of the modular button assembly by transmitting signals from the sensor to other components of the electronic device such as the processor for processing as an input.

Figure 4C:
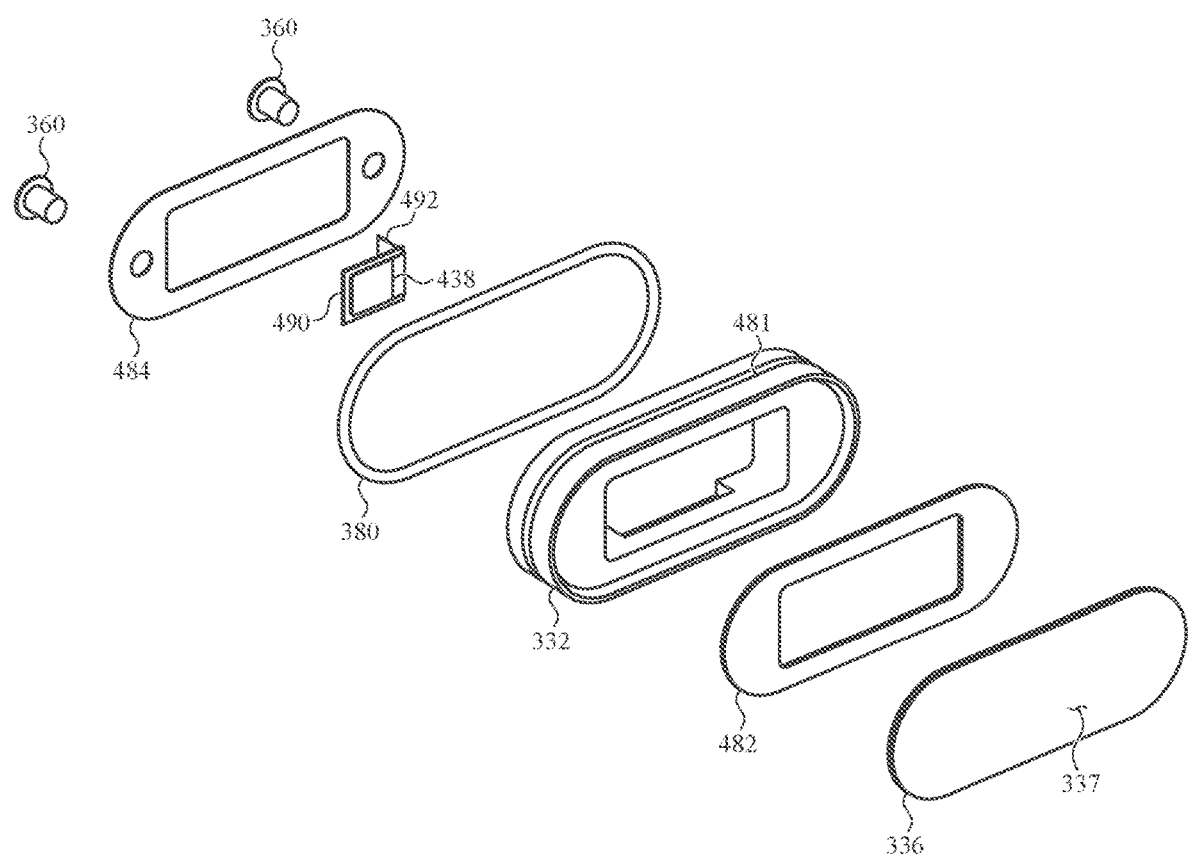
FIG. 4C illustrates an exploded view of a modular button assembly.

FIG. 4C illustrates an exploded view of a modular button assembly (e.g., modular button assembly 310 of FIGS. 3A-3B). The modular button assembly includes an input member 336, a seal 482, a button housing 332, a seal 380, a sensor 438, a sensor bracket 490, a flex cable 492, an isolation pad 484, and two attachment mechanisms 360. The seal 482 is a gasket seal made of rubber, plastic, or another suitable material and positioned between the input member 336 and a top surface of the button housing 332 to seal the button housing from contaminants.

The isolation pad 484 is positioned against a bottom surface of the button housing 332 such that when the modular button assembly is installed in an electronic device, the modular button assembly is electrically isolated from the electronic device. In one embodiment, the isolation pad 484 additionally or alternatively functions as a seal to inhibit the entry of contaminants into the electronic device and/or the button housing. For example, the isolation pad 484 may be a gasket made of rubber, plastic, or another suitable material.

The button housing 332 includes a groove 481 along an exterior sidewall. The seal 380 may be positioned in the groove 481 to maintain the seal's position in compression between the button housing 332 and the enclosure.

Figure 5:
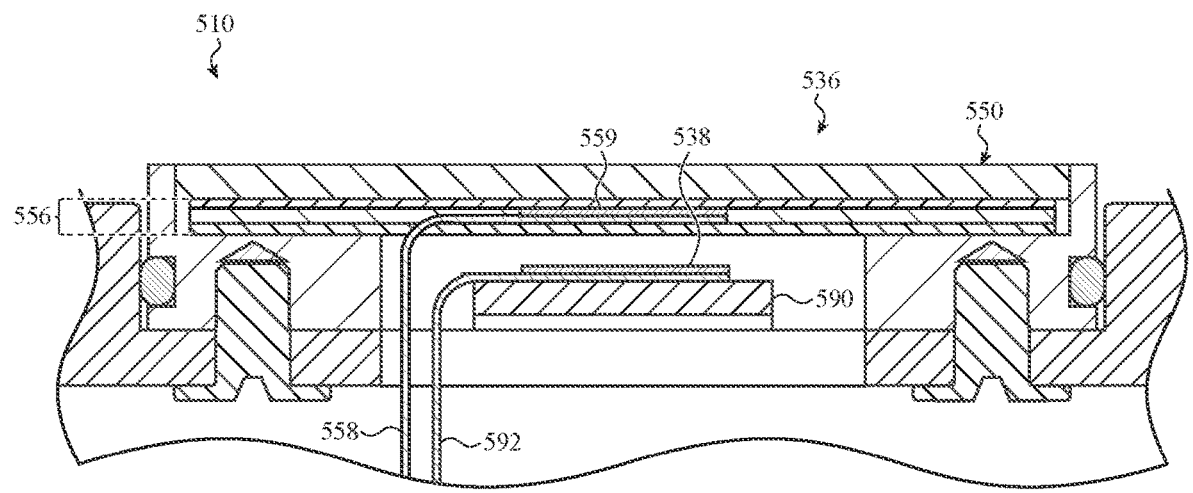
FIG. 5 illustrates a cross-section of another embodiment of a modular button assembly.
Figure 6:
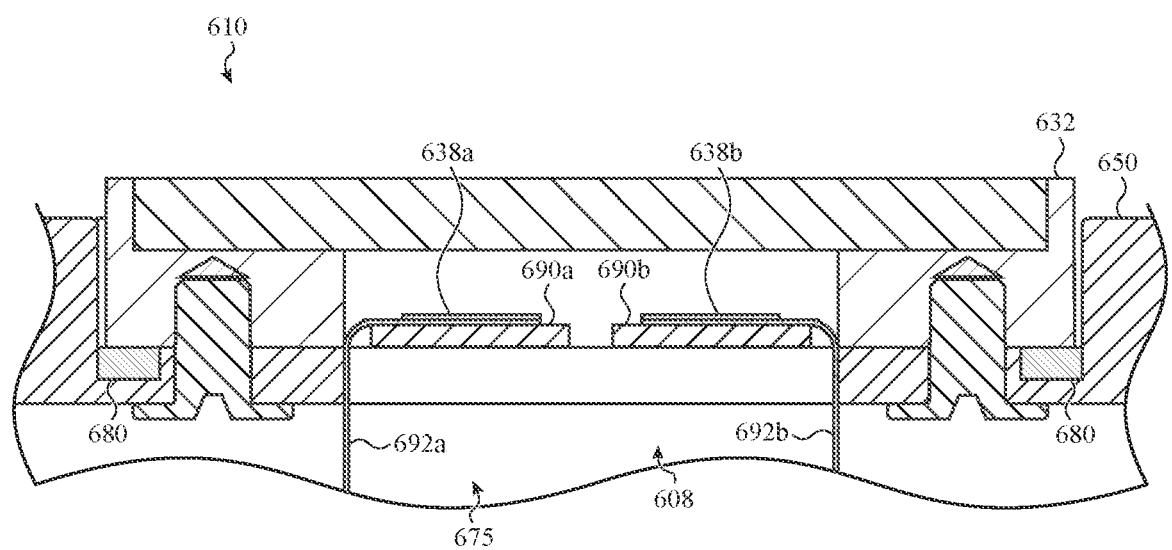
FIG. 6 illustrates a cross-section of another embodiment of a modular button assembly.

The embodiments shown and described with respect to FIGS. 3A-4C are examples of a modular button assembly for a wearable electronic device. In various embodiments, the structures, components, and arrangement thereof may differ from the described examples. FIGS. 5-6 illustrate examples of alternate embodiments for the modular button assembly described with respect to FIGS. 3A-4C.

FIG. 5 illustrates a cross-section of an alternate embodiment of a modular button assembly. The modular button assembly 510 is similar to the modular button assembly 310 described with respect to FIGS. 3A-4D. The modular button assembly 510 includes an input member 536 that includes an input surface 550, a sensor 559, a compliant region 556, and an electrical connector 558. The modular button assembly 510 further includes a sensor 538, a sensor bracket 590, and a flex cable 592.

In one embodiment, the sensor 559 is a biometric sensor configured to detect biometric inputs. For example, the sensor 559 may be implemented as a fingerprint reader located on or near the input surface 550. The sensor 559 may be any type of biometric sensor that provides a signal associated with a biometric of a user. For example, the sensor 559 may provide a signal that can be used to identify a fingerprint. The fingerprint biometric may be obtained by any means known in the art, including a capacitive fingerprint sensor, an ultrasonic fingerprint sensor, an optical fingerprint sensor, and so on.

The sensor 538 is similar to the sensors 238 and 438 discussed with respect to FIGS. 2-4. The sensor 238 and the sensor 559 may be operatively coupled. For example, in one embodiment, the sensor 238 is configured to not detect an input unless an input (e.g., a fingerprint) is detected by the sensor 559.

In another embodiment, the sensors 238 and 559 are capacitive plates that are configured to detect mutual capacitance. For example, the sensors 238 and 559 may be capacitively coupled (e.g., as capacitive plates), and an output circuit may be configured to measure the capacitance between the sensors. As the input surface translates, deflects, or otherwise moves, the measured capacitance between the sensors changes.

In one embodiment, the sensor 559 is a capacitive touch sensor configured to detect touch inputs on the input surface 550. For example, the sensor 559 may be a self-capacitive system, such that as a user's finger approaches the input surface 550, a change in capacitance between the sensor 559 and the user's finger occurs. The sensor 559 is configured to sense or measure such a change in capacitance and output a sensor signal to the electronic device via the electrical connector 558.

The compliant region 556 may be configured to seal the top surface of the button housing and to allow translational movement (e.g., up and down) of the input surface 550. The translational movement of the input surface 550 may improve the user experience by giving the user a tactile response such that the user can feel the input surface move responsive to providing an input. Further, the translational movement of the input surface may facilitate input detection by one or both of the sensors 538, 559. The compliant region 556 may have a toroidal shape such that it is disposed around one or more components of the modular button assembly 510, such as a sensor, electrical connector, or the like. The compliant region 556 may include one or more layers. In one embodiment, the compliant region 556 includes five layers, including a first heat-activated film (HAF) layer, a first polyimide (PI) layer, a silicone layer, a second PI layer, and a second HAF layer. In one embodiment, the compliant region 556 has a thickness between 0.1 mm and 1 mm.

The electrical connector 558 is attached to the sensor 552, and is configured to transmit sensor signals to other components of the electronic device such as a processor. In various embodiments, electrical connector 558 is shaped such that the cable remains securely connected to the sensor 552 during movement of the input member 536.

FIG. 6 illustrates a cross-section of a second alternate embodiment of a modular button assembly. The modular button assembly 610 of FIG. 6 is similar to the modular button assembly 310 of FIGS. 3A-4C, but includes two sensors 638a and 638b, two sensor brackets 690a and 690b, and two flex cables 692a and 692b. The sensors 638 are similar to the sensor 438 described above, and may be used to detect user inputs in a similar fashion. In the example of FIG. 6, two sensors 638 are shown, but in practice any number of sensors may be included, for example as an array of sensors. The inclusion of multiple sensors in the modular button assembly may allow the modular button assembly to collect more information regarding user inputs. For example, the outputs from multiple sensors may be compared to detect a location of an input (e.g., where a user is touching or pressing the input member). As another example, the outputs from multiple sensors may be used to detect certain movements of the input member, such as tilting, rolling, and the like. Similarly, the outputs from multiple sensors may be used to detect gestures (e.g., movements along or across the input surface).

The modular button assembly 610 further includes a seal 680 that is configured as a gasket seal similar to the seal 280 of FIG. 2 to prevent the entry of moisture or contaminants from passing into the enclosed volume 608. The seal 680 is disposed between the button housing 632 and the enclosure 650 such that the seal is compressed when the modular button assembly is disposed in the opening.

FIGS. 3A-6 and the accompanying description show and describe various embodiments of a modular button assembly for a wearable electronic device, such as an electronic watch. The modular button assembly described herein is not limited to application in a wearable electronic device, and may be installed in any electronic device. FIGS. 7-10 illustrate example embodiments of modular button assemblies for electronic devices.

Figure 7:
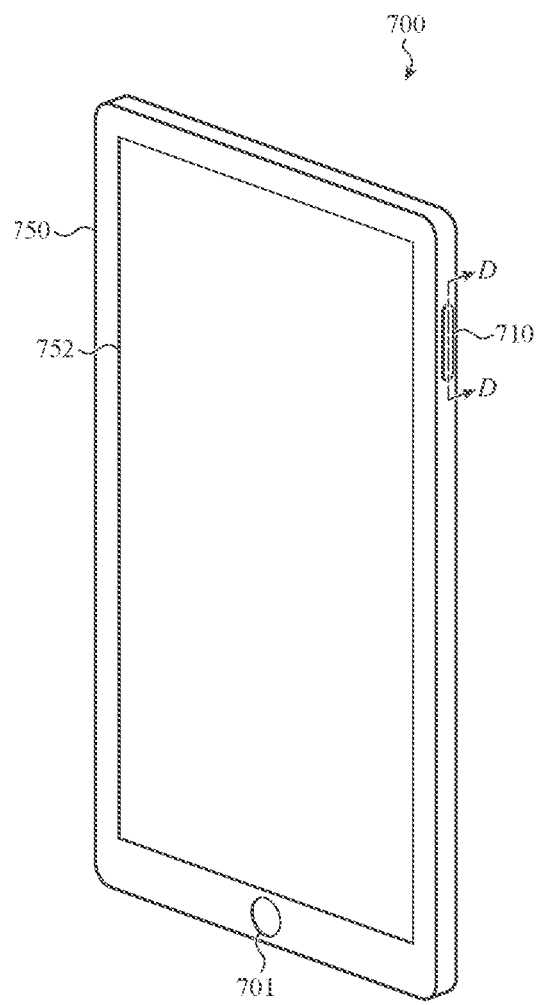
FIG. 7 illustrates an example electronic device that includes a modular button assembly as described herein.

FIG. 7 illustrates an example electronic device 700 that may incorporate a modular button assembly 710 as described herein. The electronic device 700 is a portable electronic device such as a smartphone, tablet, or the like. The electronic device 700 includes an enclosure 750 at least partially surrounding a display 752, a button 701, and one or more modular button assemblies 710. The electronic device 700 can also include one or more internal components (not shown) typical of a computing or electronic device, such as, for example, one or more processors, memory components, network interfaces, and so on. The modular button assembly 710 is disposed in a sidewall of the enclosure 750, and is permanently or releasably attached to the enclosure 750.

The modular button assembly 710 may be configured to control various functions and components of the electronic device, such as a graphical output of a display 752, an audio output, powering the electronic device on and off, and the like. A modular button assembly 710 may be configured, for example, as a power button, a control button (e.g., volume control), a home button, or the like. In one embodiment, a graphical output of the display 752 is responsive to the input provided to the modular button assembly 710.

The button 701 may be configured, for example, as a power button, a control button (e.g., volume control), a home button, and so on. In one embodiment, the button 701 includes a modular button assembly such that the button has some or all of the characteristics of the modular button assemblies described herein.

The enclosure 750 provides a device structure, defines an internal volume of the electronic device 700, and houses device components. In various embodiments, the enclosure 750 may be constructed from any suitable material, including metals (e.g., aluminum, titanium, and the like), polymers, ceramics (e.g., glass, sapphire), and the like. In one embodiment, the enclosure 750 is constructed from multiple materials. The enclosure 750 can form an outer surface or partial outer surface and protective case for the internal components of the electronic device 700, and may at least partially surround the display 752. The enclosure 750 can be formed of one or more components operably connected together, such as a front piece and a back piece. Alternatively, the enclosure 750 can be formed of a single piece operably connected to the display 752.

The display 752 can be implemented with any suitable technology, including, but not limited to liquid crystal display (LCD) technology, light emitting diode (LED) technology, organic light-emitting display (OLED) technology, organic electroluminescence (OEL) technology, or another type of display technology. The display 752 provides a graphical output, for example associated with an operating system, user interface, and/or applications of the electronic device 700. In one embodiment, the display 752 includes one or more sensors and is configured as a touch-sensitive (e.g., single-touch, multi-touch) and/or force-sensitive display to receive inputs from a user. In various embodiments, a graphical output of the display 752 is responsive to inputs provided to the modular button assembly.

Figure 8:
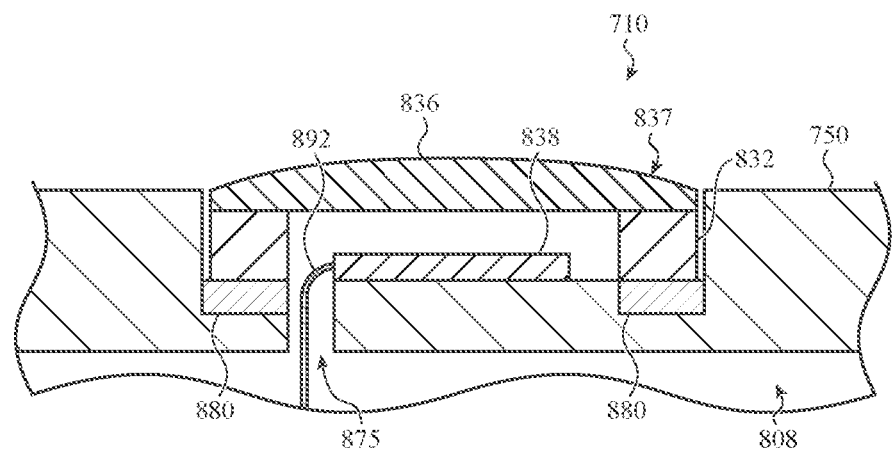
FIG. 8 illustrates a cross-section of a modular button assembly disposed in a device enclosure, along section D-D of FIG. 7.

FIG. 8 illustrates a cross-section of the modular button assembly 710 disposed in an opening of a device enclosure 750, taken through section D-D of FIG. 7. The modular button assembly 710 includes a housing 832 that houses internal components of the modular button assembly 710. Similar to the modular button assemblies described above with respect to FIGS. 2-6, the modular button assembly 710 includes an input member 836 that defines an input surface 837 for receiving user inputs, a sensor 838 for detecting inputs, and an electrical connector 892 for transmitting signals from the sensor to other components of the portable electronic device. The electrical connector 892 is attached to the sensor 838 and extends through the passage 875 and into the enclosed volume 808. The modular button assembly 710 may be attached to the enclosure 750 using any of the attachment mechanisms described above with respect to FIG. 2.

The input member 836 is shown as a separate component that is attached to the button housing 832, but in various embodiments, the input member 836 may be integrated as an exterior surface of the button housing 832, or it may be a separate component disposed on, within, or outside of the button housing 832. In the case in which the input member 836 is integrated as an exterior surface of the button housing, the button housing may define the input surface.

As shown in FIG. 8, the input member and/or the input surface may have a curved or rounded shape. The input surface 837 may have edges that are flush with a surface of the enclosure, and a section that protrudes from the enclosure. This may provide an improved user experience, for example by allowing a user to find the input surface 837 without looking at the electronic device while also maintaining a smooth overall outer surface of the electronic device.

The modular button assembly 710 further includes a seal 880 that is configured as a gasket seal similar to the seal 280 of FIG. 2 to prevent the entry of moisture or contaminants from passing into the enclosed volume 808, for example through the passage 875. The seal 880 is disposed between the button housing 832 and the enclosure 750 such that the seal is compressed when the modular button assembly is disposed in the opening. In the embodiment of FIG. 8, the seal 880 may also be an attachment mechanism, such as a waterproof adhesive, or the like.

In various embodiments, a portable electronic device may include one or more modular button assemblies 710. In one embodiment, two modular button assemblies 710 are included in a portable electronic device and function as volume control buttons. Further, a single portable electronic device may include multiple different modular button assemblies, for example having different shapes, placements, and functions. For example, a portable electronic device may include modular button assemblies functioning as volume control buttons, power buttons, home buttons, and the like.

Figure 9:
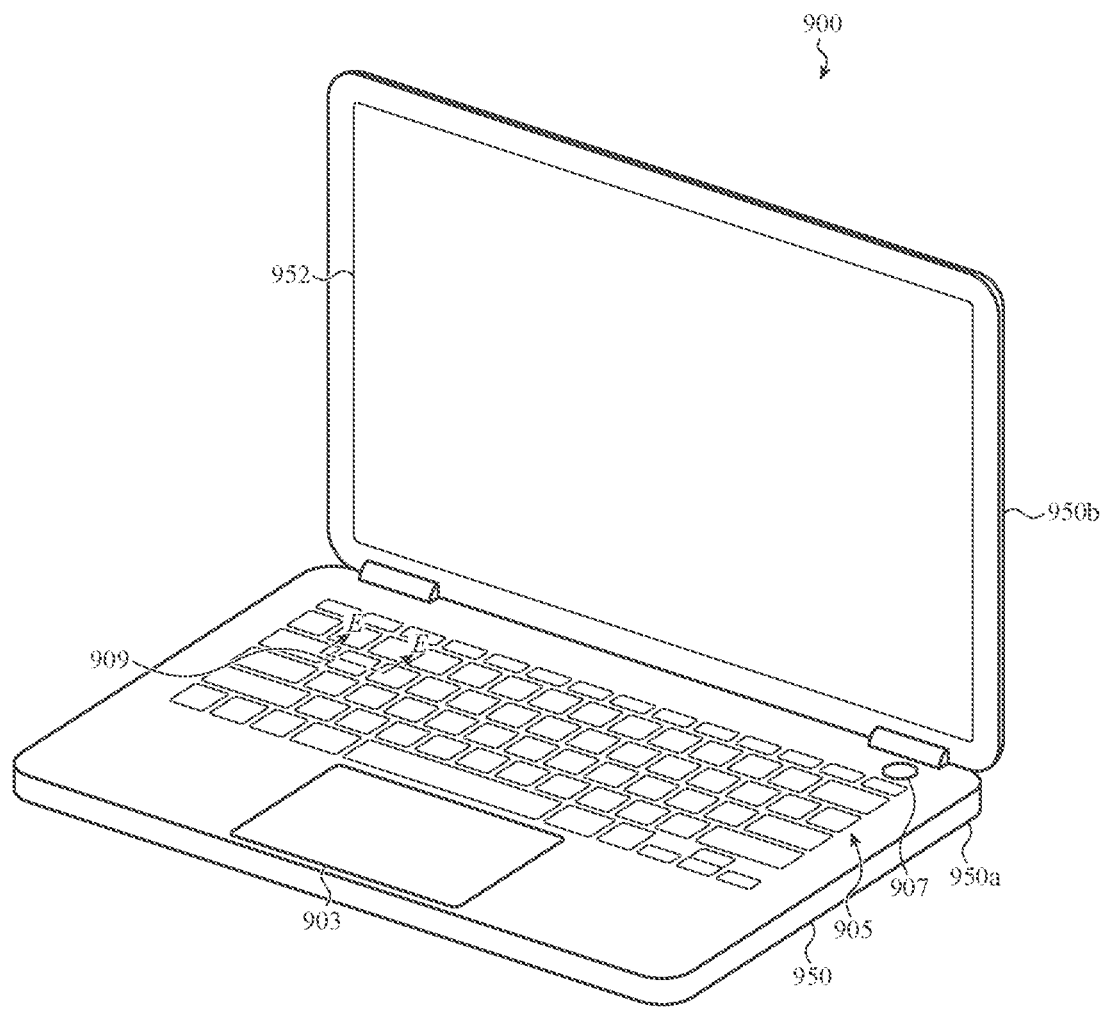
FIG. 9 illustrates an example electronic device having a modular button assembly as described herein.

In another embodiment, modular button assemblies may be included in a keyboard of an electronic device. FIG. 9 illustrates an example electronic device 900 that may incorporate one or more modular button assemblies as described herein. The electronic device 900 is similar to the electronic device 100 described above and may include similar components such as an enclosure 950, a display 952, and various internal components not shown in FIG. 9.

The enclosure 950 may include an upper portion 950*b* and a lower portion 950*a* that are pivotally or hingedly coupled by one or more hinges or joints. In one embodiment, the upper portion 950*b* is at least partially disposed around the display 952 and the lower portion 950*a* is at least partially disposed around additional device components such as a track pad 903, a power button 907, and the like. The electronic device 900 further includes a keyboard 905 that includes keys for receiving user inputs such as characters, keystroke commands, and the like.

A modular button assembly may be disposed at any of several locations of the enclosure 950. For example, the modular button assembly may be positioned along a surface of the enclosure 950. In one embodiment, the keyboard 905 includes one or more modular button assemblies 910 as keys. Additionally or alternatively, the modular button assembly may be disposed on a same surface of the keyboard, for example as a button adjacent the keyboard. In one embodiment, the power button 907 is a modular button assembly. For example, the power button 907 may be similar to the modular button assembly 110 described above with respect to FIGS. 1-2. Alternatively or additionally, the modular button assembly may be positioned on a different surface or portion of an electronic device 900, such as a sidewall, a top surface, a bottom surface, and the like.

Figure 10A:
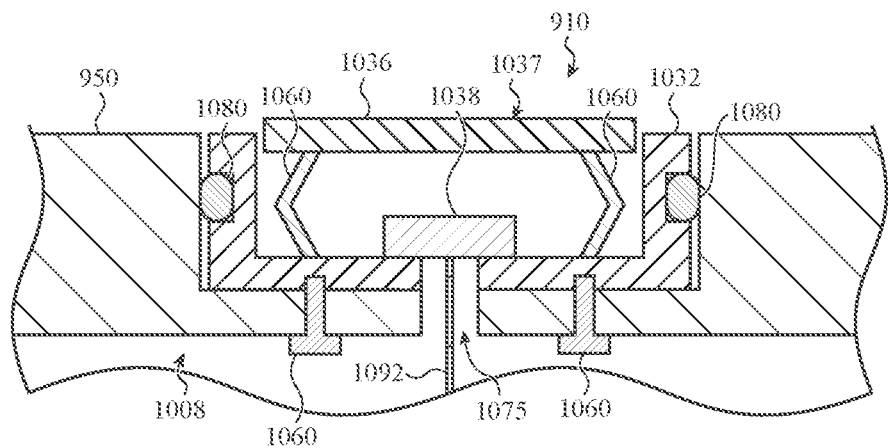
FIGS. 10A-10B illustrate a cross-section of a modular button assembly disposed in an opening of an electronic device along section E-E of FIG. 9.
Figure 10B:
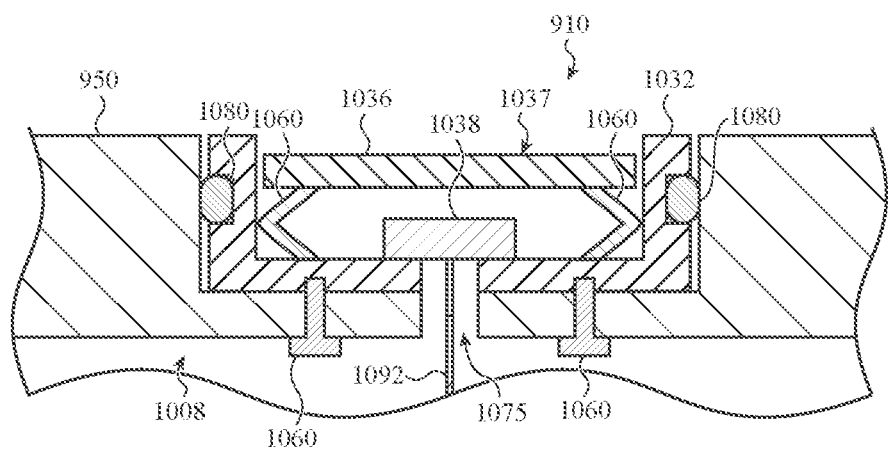

FIGS. 10A and 10B are cross-sections of a modular button assembly disposed in an opening of an electronic device taken through section E-E of FIG. 9. The modular button assembly 910 includes an input member 1036 (e.g., a keycap) that defines an input surface 1037, a button housing 1032, a sensor 1038, and travel mechanisms 1020A and 1020B. In the embodiment of FIG. 10A, the button housing 1032 is attached to the enclosure 950 using screws 1060. In various embodiments, the housing may be attached to the enclosure 950 using any of the attachment mechanisms discussed above with respect to FIG. 2. Similarly, the sensor 1038 may be any of the sensors discussed above with respect to FIGS. 2-5.

The travel mechanisms 1020 couple the input member 1036 to a surface of the housing 1032 and allow the input member to move, for example between the two positions shown in FIGS. 10A and 10B. The movement of the input member 1036 may provide a tactile response to a user pressing or otherwise interacting with the input surface 1037. The travel mechanisms 1020 may be moving mechanisms such as scissor mechanisms, domes, and so on. The travel mechanisms 1020 may also be one or more compliant members such as springs, gels, elastomers, or the like made of any suitable material. In one embodiment, the sensor 1038 is integrated with one or more travel mechanisms 1020, for example as a dome switch, a scissor switch, a mechanical switch, or another type of keyboard switch. In other embodiments, the modular button assembly does not include a travel mechanism 1020. For example, the input member 1036 may be configured to bend, deflect, or compress, or inputs may be detected without movement by the input member 1036, for example as described above with respect to FIGS. 2-8.

The modular button assembly 910 may further include an O-ring seal 1080 disposed between the button housing 1032 and the enclosure 950 such that moisture and contaminants are inhibited from entering the enclosed volume 1008 of the electronic device.

An electrical connector 1092 facilitates communication between the sensor 238 and components of the electronic device 100 (e.g., a processor). The sensor and a processor may be operably coupled by the electrical connector 1092 connected to the sensor and extending through a passage 1075 and into the enclosed volume 1008.

As described above with respect to FIG. 9, the electronic device 900 may include multiple modular button assemblies 910, for example arranged as a keyboard. The electronic device 900 may additionally or alternatively include one or more modular button assemblies having different shapes, placements, and/or functions than those described herein. For example, an electronic device may include modular button assemblies functioning as volume control buttons, power buttons, home buttons, and the like.

Figure 11:
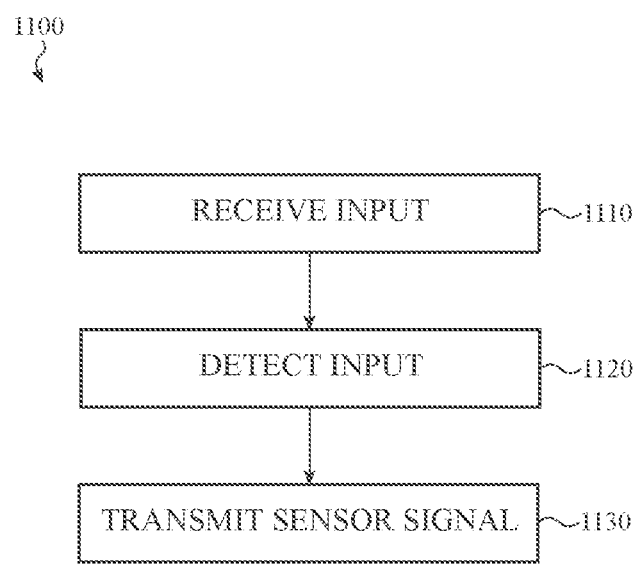
FIG. 11 is a simplified flow chart depicting example operations of a modular button assembly.

FIG. 11 is a simplified flow chart depicting example operations of a modular button assembly, such as described herein. The method 1100 includes operation 1110 in which an input member receives an input. As described above with respect to FIGS. 1-10, examples of the input include a touch, a press, a gesture, a biometric input, and so on. The input may be from a user's finger, a stylus, or another input instrument.

Next, at operation 1120, the sensor detects the input. As described above with respect to FIGS. 1-10, the sensor may be, for example, a capacitive sensor configured to detect a change in capacitance corresponding to the input. In one embodiment, the sensor generates a signal corresponding to the detected input.

Then, at operation 1130, the sensor transmits the signal to the electronic device, for example to a processor. The processor of the electronic device may process the received signal and may trigger various actions at the electronic device responsive to receiving the signal. For example, the processor may execute computer-readable instructions such as performing operations within applications, an operating system, a user interface, and the like.

FIG. 12 is an illustrative block diagram 1250 of an electronic device as described herein (e.g., electronic devices 100, 300, 700, and 900). The electronic device can include a display 1216, one or more processing units 1200, memory 1202, one or more input/output (I/O) devices 1204, one or more modular button assemblies 1206, a power source 1208, and a network communications interface 1210.

The display 1216 may provide an image or graphical output (e.g., computer-generated image data) for the electronic device. The display may also provide an input surface for one or more input devices, such as, for example, a touch sensing device and/or a fingerprint sensor. The display 1216 may be substantially any size and may be positioned substantially anywhere on the electronic device.

The processing unit 1200 can control some or all of the operations of the electronic device. The processing unit 1200 can communicate, either directly or indirectly, with substantially all of the components of the electronic device. For example, a system bus or signal line 1212 or other communication mechanisms (e.g., electronic connectors) can provide communication between the processing unit(s) 1200, the memory 1202, the I/O device(s) 1204, the modular button assemblies 1206, the power source 1208, and/or the network communications interface 1210. The one or more processing units 1200 can be implemented as any electronic device capable of processing, receiving, or transmitting data or instructions. For example, the processing unit(s) 1200 can each be a microprocessor, a central processing unit, an application-specific integrated circuit, a field-programmable gate array, a digital signal processor, an analog circuit, a digital circuit, or combination of such devices. The processor may be a single-thread or multi-thread processor. The processor may be a single-core or multi-core processor.

Accordingly, as described herein, the phrase "processing unit" or, more generally, "processor" refers to a hardware-implemented data processing unit or circuit physically structured to execute specific transformations of data including data operations represented as code and/or instructions included in a program that can be stored within and accessed from a memory. The term is meant to encompass a single processor or processing unit, multiple processors, multiple processing units, analog or digital circuits, or other suitably configured computing element or combination of elements.

The memory 1202 can store electronic data that can be used by the electronic device. For example, a memory can store electrical data or content such as, for example, audio and video files, documents and applications, device settings and user preferences, timing signals, signals received from the one or more sensors, one or more pattern recognition algorithms, data structures or databases, and so on. The memory 1202 can be configured as any type of memory. By way of example only, the memory can be implemented as random access memory, read-only memory, Flash memory, removable memory, or other types of storage elements, or combinations of such devices.

The one or more I/O devices 1204 can transmit and/or receive data to and from a user or another electronic device. The I/O device(s) 1204 can include a display, a touch or force sensing input surface such as a trackpad, one or more buttons, one or more microphones or speakers, one or more ports such as a microphone port, one or more accelerometers for tap sensing, one or more optical sensors for proximity sensing, and/or a keyboard.

The electronic device may also include one or more modular button assemblies 1206 positioned substantially anywhere on the electronic device and configured to receive inputs and transmit input signals to the electronic device, as described above with respect to FIGS. 1-11. In various embodiments, the modular button assembly may be used to control various functions and components of the electronic device, such as a graphical output of a display 1216, an audio output of the audio I/O device 1214, powering the electronic device on and off, and the like. A modular button assembly 1206 may be configured, for example, as a power button, a key of a keyboard, a control button (e.g., volume control), a home button, a watch crown, or the like. In one embodiment, a graphical output of the display 1216 is responsive to the input provided to the modular button assembly.

The power source 1208 can be implemented with any device capable of providing energy to the electronic device. For example, the power source 1208 can be one or more batteries or rechargeable batteries, or a connection cable that connects the electronic device to another power source such as a wall outlet.

The network communication interface 1210 can facilitate transmission of data to or from other electronic devices. For example, a network communication interface can transmit electronic signals via a wireless and/or wired network connection. Examples of wireless and wired network connections include, but are not limited to, cellular, Wi-Fi, Bluetooth, IR, and Ethernet.

It should be noted that FIG. 12 is for illustrative purposes only. In other examples, an electronic device may include fewer or more components than those shown in FIG. 12. Additionally or alternatively, the electronic device can be included in a system and one or more components shown in FIG. 12 are separate from the electronic device but included in the system. For example, an electronic device may be operatively connected to, or in communication with a separate display. As another example, one or more applications can be stored in a memory separate from the wearable electronic device. The processing unit in the electronic device can be operatively connected to and in communication with the separate display and/or memory.

As noted above, many embodiments described herein reference a modular button assembly for a portable electronic device. It may be appreciated, however, that this is merely one example; other configurations, implementations, and constructions are contemplated in view of the various principles and methods of operations—and reasonable alternatives thereto-described in reference to the embodiments described above.

For example, although many embodiments reference a modular button assembly in a portable electronic device such as a cell phone or tablet computer, it may be appreciated that a modular button assembly can be incorporated into any suitable electronic device, system, or accessory including but not limited to: portable electronic devices (e.g., battery-powered, wirelessly-powered devices, tethered devices, and so on); stationary electronic devices; control devices (e.g., home automation devices, industrial automation devices, aeronautical or terrestrial vehicle control devices, and so on); personal computing devices (e.g., cellular devices, tablet devices, notebook devices, desktop devices, and so on); wearable devices (e.g., implanted devices, wrist-worn devices, eyeglass devices, and so on); accessory devices (e.g., protective covers such as keyboard covers for tablet computers, stylus input devices, charging devices, and so on); and so on.

Although specific electronic devices are shown in the figures and described herein, the button assemblies described herein may be used with various electronic devices, mechanical devices, electromechanical devices, and so on. Examples of such include, but are not limited to, mobile phones, personal digital assistants, time keeping devices, health monitoring devices, wearable electronic devices, input devices (e.g., a stylus, trackpads, buttons, switches, and so on), a desktop computer, electronic glasses, steering wheels, dashboards, bands for a wearable electronic device, and so on. Although various electronic devices are mentioned, the button assemblies disclosed herein may also be used in conjunction with other products and combined with various materials.

The present disclosure recognizes that personal information data, including biometric data, in the present technology, can be used to the benefit of users. For example, the use of biometric authentication data can be used for convenient access to device features without the use of passwords. In other examples, user biometric data is collected for providing users with feedback about their health or fitness levels. Further, other uses for personal information data, including biometric data, that benefit the user are also contemplated by the present disclosure.

The present disclosure further contemplates that the entities responsible for the collection, analysis, disclosure, transfer, storage, or other use of such personal information data will comply with well-established privacy policies and/or privacy practices. In particular, such entities should implement and consistently use privacy policies and practices that are generally recognized as meeting or exceeding industry or governmental requirements for maintaining personal information data private and secure, including the use of data encryption and security methods that meets or exceeds industry or government standards. For example, personal information from users should be collected for legitimate and reasonable uses of the entity and not shared or sold outside of those legitimate uses. Further, such collection should occur only after receiving the informed consent of the users. Additionally, such entities would take any needed steps for safeguarding and securing access to such personal information data and ensuring that others with access to the personal information data adhere to their privacy policies and procedures. Further, such entities can subject themselves to evaluation by third parties to certify their adherence to widely accepted privacy policies and practices.

Despite the foregoing, the present disclosure also contemplates embodiments in which users selectively block the use of, or access to, personal information data, including biometric data. That is, the present disclosure contemplates that hardware and/or software elements can be provided to prevent or block access to such personal information data. For example, in the case of biometric authentication methods, the present technology can be configured to allow users to optionally bypass biometric authentication steps by providing secure information such as passwords, personal identification numbers (PINS), touch gestures, or other authentication methods, alone or in combination, known to those of skill in the art. In another example, users can select to remove, disable, or restrict access to certain health-related applications collecting users' personal health or fitness data.

One may appreciate that although many embodiments are disclosed above, that the operations and steps presented with respect to methods and techniques described herein are meant as exemplary and accordingly are not exhaustive. One may further appreciate that alternate step order or fewer or additional operations may be required or desired for particular embodiments.

Although the disclosure above is described in terms of various exemplary embodiments and implementations, it should be understood that the various features, aspects and functionality described in one or more of the individual embodiments are not limited in their applicability to the particular embodiment with which they are described, but instead can be applied, alone or in various combinations, to one or more of the embodiments of the invention, whether or not such embodiments are described and whether or not such features are presented as being a part of a described embodiment. Thus, the breadth and scope of the present invention should not be limited by any of the above-described exemplary embodiments but is instead defined by the claims herein presented.

What is claimed is:

1. An electronic watch comprising:
   an enclosure having a recess, an outward-facing surface in the recess, a sidewall, in the recess, that is substantially perpendicular to the outward-facing surface, and an opening through the outward-facing surface, the enclosure defining an enclosed volume, the outward-facing surface facing away from the enclosed volume;
   a display at least partially surrounded by the enclosure;
   a processor assembly operably coupled to the display and positioned within the enclosed volume of the enclosure;
   a button assembly including an input member, the input member having an inward-facing surface and an input surface, the inward-facing surface of the input member being substantially parallel to the outward-facing surface of the recess, the inward-facing surface facing toward the enclosed volume of the enclosure;
   a biometric sensor attached to the button assembly and positioned between an internal surface of the input member and the outward-facing surface of the recess, the biometric sensor being operably connected to the processor assembly; and
   a seal in contact with the recess and compressible at a position between the outward-facing surface of the sidewall recess and the inward-facing surface of the input member.

2. The electronic watch of claim 1, wherein the seal comprises a sleeve disposed around an electrical connector.

3. The electronic watch of claim 1, wherein movement of the input member perpendicular to the input surface is configured to compress the seal.

4. The electronic watch of claim 1, wherein the seal includes a waterproof adhesive material.

5. The electronic watch of claim 1, wherein the seal seals at a top interface between the seal and the inward-facing surface of the button assembly and at a bottom interface between the seal and the outward-facing surface of the enclosure.

6. An electronic watch, comprising:
   an enclosure defining an interior volume and comprising a recess that includes an outward-facing surface facing away from the interior volume, and a side surface that is substantially perpendicular to the outward-facing surface;
   a button housing attached to the enclosure, the button housing comprising an inward-facing surface facing toward the interior volume, the inward-facing surface being substantially parallel to the outward-facing surface;
   an input member positioned outward from the button housing, the input member defining an input surface and being translatable between a first position relative to the button housing and a second position relative to the button housing, the first position being located outwardly relative to the second position;
   a compliant member coupled to the button housing and to the input member;
   a fastener attaching the button housing to the enclosure and extending through the outward-facing surface of the enclosure and through the inward-facing surface of the button housing;
   wherein the compliant member is compressible at a position between the outward-facing surface of the recess and the input member in response to translation of the input member relative to the button housing from the first position to the second position.

7. The electronic watch of claim 6, wherein the compliant member seals a surface of the button housing.

8. The electronic watch of claim 6, wherein the translating movement of the input member provides a tactile response in response to an input.

9. The electronic watch of claim 6, wherein the compliant member has a toroidal shape.

10. The electronic watch of claim 6, wherein the compliant member is disposed around a sensor.

11. The electronic watch of claim 10, wherein the sensor includes a biometric sensor.

12. The electronic watch of claim 6, wherein the compliant member comprises multiple layers.

13. The electronic watch of claim 6, wherein the input member comprises an at least partially transparent material.

14. An electronic watch comprising:
   an enclosure having a first recess and defining an interior volume, wherein the first recess includes an outward-facing surface facing away from the interior volume and a side surface that is substantially perpendicular to the outward-facing surface, and
   wherein an opening extends through the first recess from the outward-facing surface to the interior volume;
   a computing device positioned inward to the outward-facing surface and within the interior volume;
   a button assembly having an inward-facing surface and a second recess, wherein the inward-facing surface is substantially parallel to the outward-facing surface and faces inward toward the interior volume;
   a first seal in contact with the first recess and positioned between the outward-facing surface of the first recess and the inward-facing surface of the button assembly; and
   a second seal positioned in the second recess external to the first seal relative to the outward-facing surface;
   wherein a fastener extends through the outward-facing surface into a portion of the button assembly.

15. The electronic watch of claim 14, wherein the first seal comprises a gasket.

16. The electronic watch of claim 14, wherein the first seal is compressible.

17. The electronic watch of claim 16, wherein the second seal is configured to move with the button assembly relative to the enclosure.

18. The electronic watch of claim 16, wherein a fastener extends through the enclosure into a portion of the button assembly.

* * * * *